United States Patent [19]

Anderson

[11] Patent Number: 4,905,306
[45] Date of Patent: Feb. 27, 1990

[54] FILTER SWITCHING ARRANGEMENT FOR A TUNER

[75] Inventor: William D. Anderson, Indianapolis, Ind.

[73] Assignee: RCA Licensing Corporation, Princeton, N.J.

[21] Appl. No.: 160,979

[22] Filed: Feb. 26, 1988

[51] Int. Cl.$^4$ .............................................. H04B 11/16
[52] U.S. Cl. ................................. 455/191; 455/340; 358/191.1
[58] Field of Search ............... 455/182, 183, 184, 188, 455/191, 192, 213, 340; 333/178, 180; 334/58, 87; 358/191.1, 195.1

[56] References Cited

U.S. PATENT DOCUMENTS

| | | | |
|---|---|---|---|
| 4,023,106 | 5/1977 | Utsunomiya | 325/462 |
| 4,379,269 | 4/1983 | Ijichi | 455/188 |
| 4,461,038 | 7/1984 | Miyoshi | 455/188 |
| 4,703,286 | 10/1987 | Muterspaugh | 331/117 |
| 4,771,332 | 9/1988 | Metoki | 455/191 |

OTHER PUBLICATIONS

"RCA Color Television Basic Service Data", 1987 CTC-140, Copyright 1987, pp. 2-17.
Schematic for the Matsushita ET17YP Tuner.

Primary Examiner—Joseph A. Orsino
Assistant Examiner—Frank M. Scutch, III
Attorney, Agent, or Firm—Joseph S. Tripoli; Peter M. Emanuel

[57] ABSTRACT

In a tunable filter including first and second inductors, a varactor diode, and a bandswitching diode connected intermediate the inductors to select the inductor configuration for first and second tuning bands, a capacitor is connected in parallel with the bandswitching diode. When the bandswitching diode is in the high impedance "non-conducting" state, the capacitor is functionally connected with other elements of the tunable filter for purposes such as trapping or tracking. When the bandswitching diode is in the low impedance "non-conducting" state, the capacitance is functionally disconnected from the tunable circuit.

21 Claims, 1 Drawing Sheet

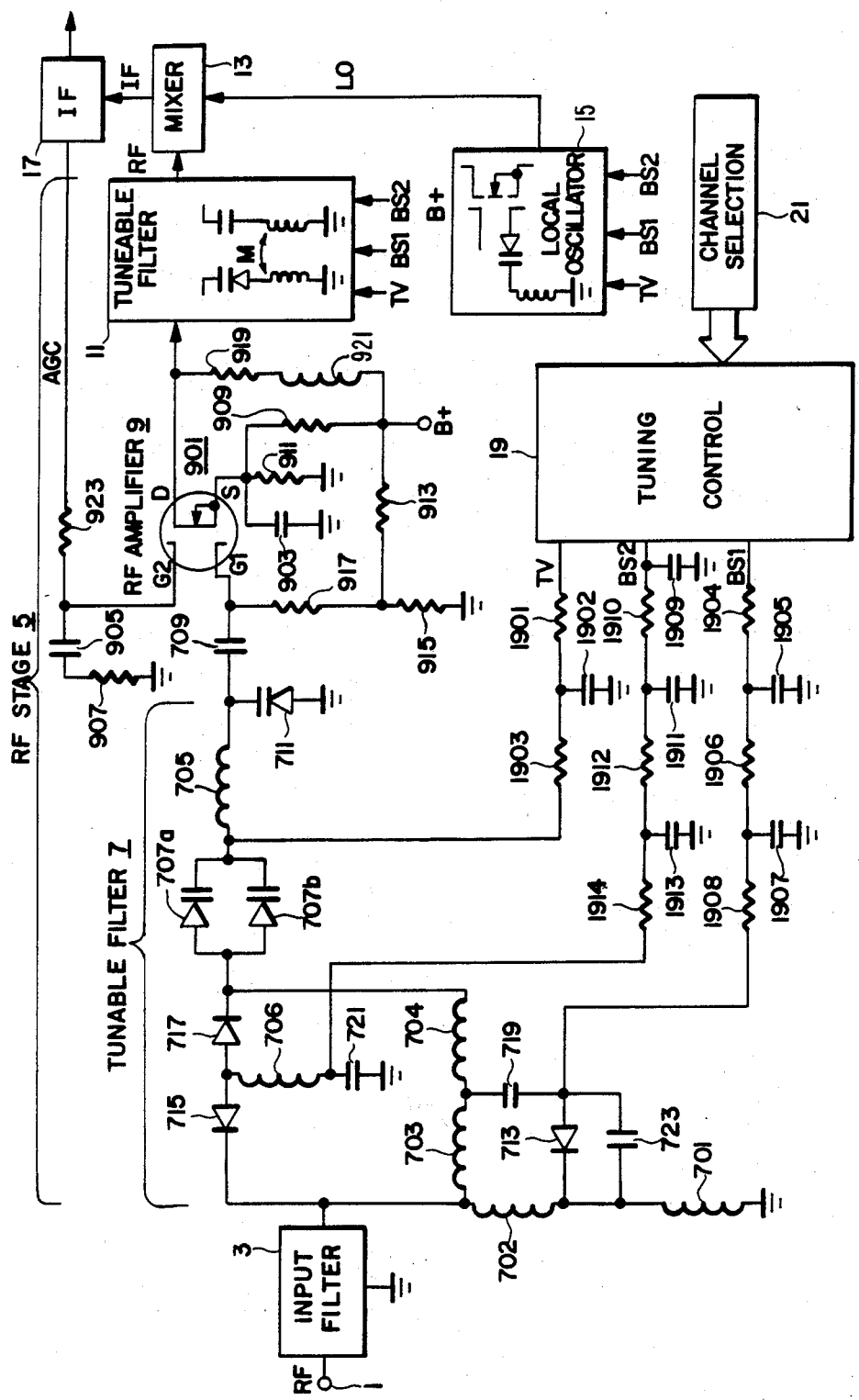

FILTER SWITCHING ARRANGEMENT FOR A TUNER

FIELD OF THE INVENTION

This invention concerns a tuner, especially for a television receiver, capable of tuning channels in different frequency bands.

BACKGROUND OF THE INVENTION

Tuners for television receivers include tunable filters in the RF amplifier and local oscillator sections. Typically, a tunable filter includes a varactor diode exhibiting a variable capacitance controlled in response to a tuning voltage, two or more inductance elements, and at least one bandswitching diode connected to the inductance elements for selecting the inductance configuration of the tunable circuit in response to a bandswitching signal.

Additional reactive elements may be associated with the tunable filter for various reasons. For example, elements may be provided to produce trap or other filter response for rejecting or inhibiting unwanted signals. Elements may also be provided to make the frequency selective response of a tunable filter in one part of the tuner track the frequency response of another tunable filter in another part of the tuner.

Sometimes it is desirable that the additional reactance elements be functionally connected in one band but not in another band. For example, it may be desirable to have a trap active for one band but inactive in another band in which it may interfere with the desired function of the associated tunable filter. Of course, a second switching diode responsive to the bandswitching signal (in addition to the bandswitching diode used to select the inductance configuration) may be provided for the latter purpose.

It is desirable that extra reactance and switching elements be kept to a minimum for cost and reliability purposes. This goal can be accomplished by making dual use of at least some existing elements of the tunable circuit itself.

U.S. Pat. No. 4,023,106 issued in the name of Keisake Utsunomiya, discloses an example of such an arrangement. In the disclosed arrangement, an additional capacitor is provided to form a trap with an inductor otherwise used for impedance matching in a first band. A bandswitching diode functionally disconnects both the capacitor and the inductor in a second band. Thus the inductor is not available for use in the second band.

SUMMARY OF THE INVENTION

It is here recognized that it is desirable to provide an arrangement in which an additional reactance element is provided to cooperate with an existing element of a tunable circuit in a first band but not in a second band without disturbing the availability of the existing element in the second band.

Specifically, in accordance with the present invention, in a tuning apparatus comprising a tunable filter including a varactor diode, first and second inductance elements, and a bandswitching diode connected to the inductance elements for selecting the inductance configuration of the tunable circuit an additional reactance element, e.g., a capacitor for forming a trap with the first inductance element for unwanted signal or for tracking, is connected in parallel relationship with the bandswitching diode. In this manner, the additional capacitance element is functionally connected to the first inductance element of the tunable filter when the bandswitching diode is in a high impedance "non-conducting" state in a first band and is functionally disconnected from the tunable circuit when the bandswitching diode is in a low impedance "conducting" state in a second band, without functionally disconnecting the first inductance element from the tunable circuit.

BRIEF DESCRIPTION OF THE DRAWING

The sole FIGURE of the Drawing shows the VHF section of a television tuner constructed in accordance with the principles of the present invention.

DETAILED DESCRIPTION OF THE DRAWING

The tuning apparatus shown in the FIGURE is capable of tuning both broadcast and cable channels in the VHF range. An RF signal input 1 receives RF signals from a broadcast receiving antenna (not shown) or a cable distribution network (also not shown). An input filter section 3 is coupled between RF signal input 1 and an RF stage 5. Input filter 3 includes a plurality of fixed traps for inhibiting signals generated within the receiver, such as the IF picture and sound carriers derived from the RF signal of the tuned channel, from being coupled to RF signal 1 and thereby to the broadcast receiving antenna or cable distribution network. Input filter 3 may also include traps for inhibiting unwanted RF signals, such as those in the citizens band (CB), from reaching RF stage 5.

RF stage 5 includes a tunable filter circuit 7 coupled between the output of input filter 3 and the input of an RF amplifier 9. Tunable filter 7 exhibits a bandpass amplitude versus frequency response for allowing the RF signal corresponding to a channel to be tuned to each RF amplifier 9 while inhibiting other RF signals from reaching RF amplifier 9. The bandpass characteristic is controlled in response to a tuning voltage (TV) and bandswitching signals (BS1 and BS2) change in frequency in accordance with the selected channel. The configuration of tunable filter 7 and the selective function connection of an associated additional reactive element is the subject matter of the present invention and will be described in detail below after a brief description of the remaining portion of the tuner.

RF amplifier 9 includes a dual gate N channel metal oxide semiconductor (MOS) field effect transistor 901 having a first gate electrode G1, a second gate electrode G2, and source S and drain electrodes D connected to opposite ends of a N-type conduction channel. FET 901 is configured as a cascade amplifier in which source electrode S is bypassed to signal ground in the VHF range by a relative high value (e.g., 470 picofarads) capacitor 903, first gate electrode G1 is used as the input of RF amplifier 9, second gate electrode G2 is effectively bypassed to signal ground through the series combination of a relatively high value (e.g., 470 picofarads) capacitor 905 and a relatively low value (e.g., 22 ohms) resistor 907, and drain electrode D is used as the output of RF amplifier. A bias voltage for source electrodes is developed from a B+ supply voltage (e.g., 12 volts) by a voltage divider network including a resistor 909 (e.g., 1500 ohms) and a resistor 911 (e.g., 270 ohms). A bias voltage for first gate electrode G1 is developed by a voltage divider network including a resistor 913 (e.g., 100 kilohms), a resistor 915 (e.g., 56 kolohms) and a resistor 917 (e.g., 100 kilohms). The load for FET 901 comprises a resistor 919 (e.g., 22 ohms) and choke inductor 921 connected in series between the source of the B+ supply voltage and drain electrode D. An automatic gain control (AGC) signal is applied to second gate electrode G2 through a resistor 923 (e.g., 2.2 megohms).

The amplified RF signal provided by RF amplifier 9 is coupled to another tunable filter 11 having a bandpass chracteristic controlled in response to the tuning voltage (TV) and the bandswitching signals (BS1 and BS2) to allow the RF signal corresponding to the channel to be tuned to pass to a mixer 13. Tunable filter 11 may comprise a double-tuned circuit including two series-tuned circuits the inductive elements of which are magnetically coupled together, as is indicated within, the corresponding block.

Mixer 13 also receives a local oscillator signal generated by a local oscillator 15. The frequency response of the tunable filter of local oscillator 15 is also controlled in response to the tuning voltage (TV) and bandswitching signals (BS1 and BS2) to control the frequency of the local oscillator signal in accordance with the channel selected to be tuned. Local oscillator 15 includes a tunable filter (e.g., in series configuration as shown) and an amplifier (e.g., comprising a dual gate MOS FET) and also receives B+ supply voltage.

Mixer 13 combines (heterodynes) the local oscillator signal and the amplifier RF signal to produce frequency difference and sum products. The frequency difference product of mixer 13 is the desired component. A filter within an IF section 17 has a bandpass filter characteristic for passing and tailoring the amplitude versus frequency response characteristic of the frequency difference component produced by mixer 13. The filtered IF signal contains modulated picture and sound carriers corresponding to those of the RF signal received from RF amplifier 9. The output of IF section 17 is applied to the demodulation and signal processing sections (not shown) of the receiver. IF section 17 also produces the AGC signal coupled to RF amplifier 9 and an automatic fine tuning (AFT) signal (not shown) which is used by a tuning control unit 19 in generating the tuning voltage.

Tuning control unit 19 generates the tuning voltage (TV) and bandswitching signals (BS1 and BS2) in response to the channel selection information representing, e.g., in digital form, the channel number of the channel to be tuned received from a channel selection unit 21. Channel selection unit 21 may comprise a keyboard directly mounted on the receiver or on a remote control transmitter. A voltage or frequency synthesizer may be used to generate the tuning voltage in accordance with the channel number. The AFT signal produced by IF section 17 may be, and typically is, also used in the generation of the tuning voltage to account for component value changes and possible frequency offsets (with respect to standard broadcast values) of the carriers of the RF signals encountered in cable distribution networks. The bandswitching signals (BS1 and BS2) are generated in direct response to the channel number by a digital decoder.

While the B+ supply voltage is indicated as being supplied continuously, it will be appreciated that in practice the supply voltage B+ is selectively applied to either the VHF section or the UHF section dependent on whether the selected channel is a VHF or UHF channel. This function is also provided by tuning control unit 19.

The tuning voltage (TV) and the bandswitching signals (BS1 and BS2) generated by tuning control unit 19 are coupled to the tunable circuits 7 and 11 of RF stage 5 and the tunable circuit of local oscillator 15.

Each tunable circuit includes one or more variable capacitive reactance (varactor) diodes and at least two inductors. The tuning voltage is applied to the varactor diode so as to reverse bias it. As the magnitude of the tuning voltage increases the capacitance exhibited by the varactor diode decreases. The tunable circuit is configured so that the passband moves upward in frequency as the magnitude of the tuning voltage increases and the capacitance of the varactor diode decreases.

Bandswitching diodes responsive to the bandswitching signals are used to select the inductor configuration of the tunable circuit in accordance with the band of the channel selected to be tuned. This has been found necessary because a single configuration of inductors cannot provide practical tuning over the entire VHF range, especially when cable as well as broadcast channels are to be tuned. By way of example, the bandswitching signals are caused to switch between a low voltage level, e.g., $-12$ volts, and a high voltage level, e.g., $+12$ volts, to cause the bandswitching diodes to switch from a high impedance "non-conducting" state to a low impedance "conducting" state, respectively.

The following table indicates the relationship of the bands, channel designations, RF signal frequency ranges, local oscillator signal frequency ranges and bandswitching signal levels for the embodiment shown in the FIGURE when employed in the United States. The channel designations with only numbers are broadcast channels and the channel designation with letters are cable channels.

| Band | Channel | RF Range MHz | LO range MHz | BS1 | BS2 |
|---|---|---|---|---|---|
| 1 | 2 tuner 6 | 55–88 | 101–129 | Low | Low |
| 2 | A-2 thru 13 | 109–216 | 155–257 | High | Low |
| 3 | J thru W+28 | 217–468 | 263–509 | High | High |

Attention is now directed to tunable filter 7 with which the present invention is more directly concerned.

Tunable filter 7 comprises inductors 701, 702, 703, 704, 705 and 706 (e.g., 60, 68, 306, 68, 28 and 12 nanohenries, respectively) and a variable capacitance element including varactor diodes 707a and 707b. Varactor diodes 707a and 707b are connected in parallel and are both poled to exhibit decreasing capacitances in response to increases in the tuning voltage (TV). In each band, the selected inductors and varactor diodes 707a and 707b configure tunable filter 7 essentially as a series tuned circuit having an output at the right end of inductor 705. The output of tunable filter 7 at the right end of inductors 705 is coupled to the input of RF amplifier 9 at gate electrode G1 of FET 901 through a DC blocking capacitor 709 having a relatively high capacitance (e.g., 470 picofarads) so as to exhibit a negligible impedance in the VHF range. Inductor 705 is connected between the jointly connected cathodes of varactor diodes 707a and 707b and the input of RF amplifier 9 to isolate varactor diodes 707a and 707b from stray capacitances associated with the input of FET amplifier 9.

Inductors 701, 702, 703, 704 and 705 are utilized in bands 1 and 2 and inductors 706 and 705 are primarily used in band 3. In each band the inductors are configured to: (1) form an impedance matching network between the output of input filter 3, which exhibits a nominal output impedance of 75 ohms, and the input of RF amplifier 9, which exhibits an input impedance of about 2 kilohms in band 1, about 1 kilohm in band 2 and about 400 ohms in band 3; and (2) form a series tuned circuit with varactor diodes 707a and 707b between the input of RF amplifier 9 and signal ground. The impedance matching function is desirable to optimize power transfer from input filter 3 and RF amplifier 9.

An auxiliary varactor diode 711 is connected in shunting relationship with the RF signal path between the output of tunable filter 7 and the input of RF amplifier 9 and is poled, like varactor diodes 707a and 707b to exhibit a decreasing capacitance as the tuning voltage increases. Auxiliary varactor diode 711 serves as a variable impedance matching element.

The tuning voltage is coupled to the cathodes of varactor diodes 707a, 707b and 711 through a filter including series resistor 1901 (e.g., 51 ohms), a shunt capacitor 1902 (e.g., 1470 picofarads) and a series resistor 1903 (e.g., 100 kilohms). The anodes of varactor diodes 707a and 707b are biased at ground potential by virtue of the DC path provided by inductors 704, 703, 702 and 701. The anode of varactor diode 711 is also biased at ground by virtue of its direct connection to ground.

Bandswitching diodes 713, 715 and 717, controlled in response to bandswitching signals BS1 and BS2, control the inductance configuration of tunable filter 7.

Bandswitching diode 713 is connected in series with a capacitor 719 (e.g., 150 picofarads) between the junction of inductors 701 and 702 and the junction of inductors 703 and 704. The BS1 bandswitching signal is coupled to the anode of bandswitching diode 713 through a filter including a series resistor 1904 (e.g., 240 ohms), a shunt capacitor 1905 (e.g., 2200 picofarads), a series resistor 1906 (e.g., 51 ohms), a shunt capacitor 1907 (e.g., 2200 picofarads) and a series resistor 1908 (e.g., 4700 ohms). The DC return for the BS1 bandswitch signal is provided by the connection of the cathode of bandswitching diode 713 to ground through inductor 701.

Bandswitching diodes 715 and 717 are connected in series with opposing polings between the output of input filter 3 and the anodes of varactor diodes 707a and 707b. Inductor 706 is connected in series with a capacitor 721 between the junction of the anodes of bandswitching diodes 715 and 717 and signal ground. The BS2 bandswitching signal is coupled to the anodes of bandswitching diodes 715 and 717 through a filter including shunt capacitor 1909 (e.g., 2200 picofarads), a series resistor 1910 (e.g., 201 ohms), a shunt capacitor 1911 (e.g., 2200 picofarads), a series resistor 1912 (e.g., 22 ohms), a shunt capacitor 1913 (e.g., 2200 ohms), and a series resistor 1914 (e.g., 750 ohms). The DC return path for the BS2 bandswitching signal with respect to bandswitching diode 715 is provided by the connection of the cathode of bandswitching diode 715 to ground through inductors 702 and 701 and with respect to bandswitching diode 717 by the connection of the cathode of bandswitching diode 717 to ground through inductors 704, 703, 702 and 701.

In band 1, bandswitching signals BS1 and BS2 are both at the low voltage level (e.g., −12 volts) and, as a result, all of the bandswitching diodes are in the high impedance "non-conducting" state. Accordingly, only inductors 701, 702, 703, 704 and 705 are functionally connected in tunable filter 7. In this first configuration of tunable filter 7, a so-called impedance "step-up" arrangement is found between the output of input filter 3 and the input of RF amplifier 9. In this "step-up" arrangement, an inductive voltage divider including inductors 705, 704, 703, 702 and 701 is connected between the input of RF amplifier 9 and signal ground. The RF output signal of input filter 3 is applied to the junction of inductors 702 and 703 and a proportionally higher amplitude RF signal, determined by the voltage division relationship, is caused to be developed at the input of RF amplifier 9.

In band 2, bandswitching signal BS1 is at the high voltage level (e.g., +12 volts) and bandswitching signal BS2 is at the low voltage level (e.g., −12 volts). As a result, bandswitching diode 713 is in the low impedance "conducting" state and bandswitching diodes 715 and 717 are in the high impedance "non-conducting" state. Accordingly once again, only inductors 705, 704, 703, 702 and 701 are functionally connected in tunable circuit 7. However, unlike in band 1, capacitor 719 (e.g., 150 picofarads) is functionally connected across the series connection of inductors 703 and 702. As a result, inductors 703 and 702 are affectively connected in parallel and inductor 704 is connected to the junction of parallel connected inductors 703 and 702 and inductor 701. In this second configuration of tunable filter 7, the parallel combination of inductors 702 and 703 in series with inductor 701 form a "step-down" voltage divider arrangement and inductors 705, 704 and 701 form a "step-up" voltage divider arrangement. In the "step-down" voltage divider arrangement, the RF signal provided at the output of input filter 3 is divided in amplitude to provide a proportionally lower amplitude RF signal at the junction of parallel connected inductors 703 and 702 and inductor 701. In the "step-up" voltage divider arrangement, the RF signal at the junction of parallel connected inductors 703 and 702 and inductor 701 is multiplied in amplitude to provide a portionally higher amplitude RF signal at the input of RF amplifier 9.

In band 3, bandswitching signals BS1 and BS2 are both at the high voltage level (e.g., +12 volts) and all of bandswitching diodes 713, 715 and 717 are in the low impedance "conducting" state. Accordingly, in band 3, inductor 706 and capacitor 721 are connected in series between the output of input filter 3 and signal ground to form a third configuration of tunable filter 7. Since capacitor 721 has a relatively large capacitance (e.g., 150 picofarads) inductor 706 and inductor 705 form an inductive "step-up" voltage divider arrangement. Inductors 704, 703, 702 and 701 are configured as in band 2, since bandswitching diode 713 is also in the conducting state, and this combination is connected in parallel with inductor 706. However, since inductors 704, 703, 702 and 701 have large inductances (e.g., 68, 306, 68 and 60 nonohenries, respectively) compared with the inductance (e.g., 12 nonohenries) of inductor 706, the third configuration of tunable filter 7 primarily includes inductors 705 and 706.

The portion of tuner so far described is very similar to the corresponding portion of the ADT tuner employed in RCA television CTC-140 receivers chassis which were offered for sale in May 1987. A schematic of the ADT tuner appears on page 2-17 of "RCA Color Television Basic Service Data", 1987 CTC-140, published by the GE/RCA Consumer Electronics Business, Indianapolis, Ind. A similar tuner is also described in U.S.

Pat. No. 4,703,286, which issued in the name of Max W. Muterspaugh on Oct. 27, 1987.

The present invention specifically concerns an additional reactive element used, e.g., for trapping or tracking, and the use of an existing bandswitching diode for functionally connecting it "in circuit" with tunable filter 7 in one band and for functionally disconnecting it from tunable circuit 7 in another band. Specific attention is now directed to capacitor 723 connected in parallel with bandswitching diode 713.

In band 1, when bandswitching diode 713 is in the high impedance "non-conducting" state, capacitor 723 is functionally connected in circuit with the other elements of tunable circuit 7 such as inductor 701. In band 2, when bandswitching diode 713 is in the low impedance "conducting" state, capacitor 723 is bypassed by low impedance conducting bandswitching diode 713 and is therefore functionally disconnected from the other elements of tunable circuit 7. However, the functional connection of inductor 701 in tunable filter 7 is not disturbed. Thus, inductor 701 is available for use in both bands 1 and in band 2.

It is also noted that in band 3, since bandswitching diode 713, as well as bandswitching diodes 715 and 717, is also in the low impedance "conducting" state, capacitor 723 is also functionally disconnected from tunable filter 7. While the effect of capacitor 723 on band 3 operation is of no particular concern (whether or not bandswitching diode 713 is conducting) with the exemplary element values given, the latter may be of use where the element values are different.

The value of capacitor 723 determines the specific filtering function to be performed and two examples are given below. However, it is noted that by connecting capacitor 723 in parallel with bandswitching diode 713, alreading utilized to select the inductance configuration of tunable circuit 7, a filtering function useful in one band but undesired in another is provided with a minimum number of additional components. This serves to reduce the cost and improve the reliability of the tuner.

Examples of the uses of capacitor 723 will now be discussed.

While tunable filter 7 is intended to pass only the desired signal and to reject undesired signals, it may not be selective enough, to sufficiently reject all undesired signals, especially if a particular undesired signal is strong. In this regard, the value of capacitor 723 may be chosen to form a filter for inhibiting undesired signals from being coupled between input filter 3 and RF amplifier 9.

More specifically, in band 1, when switching diode 713 is in the high impedance state the received RF signals pass through an RF signal path comprising inductors 703 and 704 before reaching input of RF amplifier 9 and the series combination of capacitor 719, capacitor 723 and inductor 701, connected intermediate inductors 703 and 704, shunts the RF signal path. Thus, capacitor 719, capacitor 723 and inductor 701 are suitably arranged to form a series trap shunting the RF signal path. With the exemplary values indicated above, by which capacitor has a relatively large capacitance (e.g., 150 picofarads), the trap frequency is primarily dependent on the values of capacitor 723 and inductor 701. Since the inductance of inductor 701 is established by the function of tunable filter 7 to pass the RF signal corresponding to the channel selected for tuning, in practice, the trap frequency is set by choosing the capacitance of capacitor 723.

Theoretically, when the value of capacitor 719 is large (e.g., 150 picofarads), the frequency of the trap is given by:

$$f = \frac{1}{2\pi \sqrt{L_{701} C_{723}}}$$

where $L_{701}$ is the inductance due to discrete inductor 701 and $C_{723}$ is the capacitance of discrete capacitor 723. However, the affects of stray capacitance and lead inductance should be considered. In that case $L_{701}$ should be the total of the discrete and lead inductance and $C_{723}$ should be the total of the discrete and stray capacitance.

One particular advantageous use of capacitor 723 as a trap forming element is described next.

In a VHF tuner employed in the United States, it is particularly desirable but difficult to inhibit the so-called undesired "channel 6 image" signal since that undesired signal has a frequency corresponding to channel 7 and channels 6 and 7 are often both assigned in a given reception area. The RF picture carrier for channel 6 has a frequency of 83.25 MHz. Therefore, the desired local oscillator frequency for tuning channel 6 to produce the nominal IF picture carrier frequency is 129 MHz (i.e., 129−83.25 MHz=45.75 MHz). The RF picture carrier for channel 7 has a frequency of 175.25 MHz. Unfortunately, the difference between the 175.25 MHz frequency of the RF picture carrier for channel 7 and the 129 MHz frequency for channel 6 is 46.25, only 0.5 MHz from the nominal IF picture carrier frequency of 45.75 MHz. Therefore, if the RF picture carriers for both channel 6 and channel 7 reach mixer 13 when it is desired to tune channel 6, the IF picture carrier for channel 7 may interfere with the IF picture carrier for channel 6. A fixed trap for rejecting the RF signal for channel 7 is, of course, not practical since it would interfere with the tuning of channel 7.

The location of capacitor 723 in parallel with bandswitching diode 713 is ideally suited to form a trap for reducing channel 6 image frequency interference since capacitor 723 is functionally connected in circuit with inductor 701 when channel 6, which is in band 1, is selected to be tuned and functionally disconnected from tunable filter 7 when channel 7, which is in band 2, is selected to be tuned. With the exemplary values of tunable circuit 7 set forth above, and with a lead inductance of 30 nanohenries a stray capacitance of 2 picofarads, if capacitor 723 is chosen to be a 7 picofarad capacitor, a trap is formed at 177 MHz. This trap was found to provide an improvement in channel 6 image rejection of about 10 db or more as compared to the situation in which capacitor 723 is absent.

Capacitor 723 can also be used to improve the tracking of tunable filter 7 with other tunable filters employed in the tuner. Tracking is the ability of two tunable circuits to produce frequency selective characteristics which change together as a function of the tuning voltage. The frequency selective responses of two tunable filters may not change together to the degree desired because the tunable filters may have different configuration and be coupled to circuits exhibiting different impedance levels. For example, in the present embodiment, the frequency selective response of tunable filter 11 coupled to the output of RF amplifier 9 was found to change more rapidly as a function of the tuning voltage than tunable filter 7 coupled to the input of RF amplifier 9) in band 1. For example, it was found that when capacitor 723 was reduced from 7 picofarads, selected for the trapping function, to 4 picofarads the tracking between tunable filters 7 and 11 of RF stage 5 and also the tunable filter of local oscillator 15 and therefore also with the frequency of the local oscillator signal improved significantly in band 1. This tracking improvement was found to be at the expense of channel 6 image rejection. Capacitor 723 does not adversely affect the operation of tunable filter 7 in band 2 since capacitor 723 is functionally disconnected from tunable filter 7 by virtue of conducting bandswitching diode 713.

While stray capacitance is to be considered in selecting the value of discrete capacitor 723 to produce a particular filtering function, stray capacitance alone, which may be exhibited across switching diode 713, was not found to produce a noticeable effect on band 1 operation with the exemplary values given.

What is claimed:

1. Tuning apparatus for tuning channels with respective RF signals occurring in first and second frequency bands comprising:
   a RF signal input;
   a RF signal output;
   tunable filter means coupled between said RF signal input and said RF signal output and having a frequency selective response characteristic controlled in response to a tuning control signal representing a channel to be tuned for allowing the RF signal corresponding to the channel to be tuned to pass from said RF signal input to said RF signal output; said tunable filter means including a variable capacitance element responsive to said tuning control signal, first and second inductance elements, and a bandswitching diode having a high impedance state and a low impedance state selectable in response to a bandswitching signal representing the frequency band of the selected channel and connected to a point intermediate said first and second inductance elements for forming a first configuration of said tunable filter means including both of said first and second inductance elements for tuning channels in said band when in said high impedance state and for forming a second configuration of said tunable filter means including one but not the other of said second inductance elements for tuning channels in said second band when in said low impedance state; and
   a second capacitance element connected in parallel with said bandswitching diode to be functionally connected to said tunable filter means when said bandswitching diode is in said high impedance state and to be functionally disconnected from said tunable filter means when said bandswitching diode is in said low impedance state.

2. The tuning apparatus recited in claim 1 wherein:
   said bandswitching diode is in said high impedance state for broadcast television channels 2 through 6 and in said low impedance state for broadcast television channels 7 through 13.

3. The tuning apparatus recited in claim 2 wherein:
   said second capacitance element and first inductance element form a trap for inhibiting the RF signal corresponding to broadcast channel 7 from passing from said RF signal input to said RF signal output when said bandswitching diode is in said high impedance state.

4. The tuning apparatus recited in claim 1 wherein:
   said second capacitance element and said first inductance element form a trap for inhibiting an unwanted signal from passing between said RF signal input and said RF signal output when said bandswitching diode is in said high impedance state.

5. The tuning apparatus recited in claim 1 wherein:
   a second tunable filter also responsive to said tuning control signal is provided; and
   said second capacitance element has a value chosen to enhance the tracking between the frequency selective response characteristics of said first and second tunable filter means as said tuning control signal is varied when said bandswitching diode is in said high impedance state.

6. The tuning apparatus recited in claim 5 wherein:
   a RF amplifier comprising a field effect transistor (FET) having gate, source and drain electrodes,; said RF output being connected to said gate electrode; said drain electrode being connected to said second tunable filter means.

7. The tuning apparatus recited in claim 1 wherein:
   a series connection of said second capacitance and said first inductance are connected shunting a RF signal path between said RF input and said RF output is formed when said bandswitching diode is in said high impedance state.

8. The tuning apparatus recited in claim 7 wherein:
   a RF amplifier is coupled to said RF output;
   said second and first inductance elements are connected in series, in the order named, between a point of reference potential and said RF signal input;
   third and fourth inductance elements are connected in series between said RF signal input and said RF signal output; and
   said bandswitching diode is connected between a point between said third and fourth inductance elements and a point between said first and second inductance elements.

9. The tuning apparatus recited in claim 8 wherein:
   said RF amplifier includes a field effect transistor having a gate electrode connected to said RF output.

10. The tuning apparatus recited in claim 8 wherein:
    a third capacitance elements is connected in series with said bandswitching diode between said point between said third and fourth inductance elements and said point between said first and second inductance elements: and
    said second capacitance is connected across the series connection of said bandswitching diode and said third capacitance element.

11. The tuning apparatus recited in claim 10 wherein:
    said third capacitance has a value chosen so that third capacitance has negligible impedance in said first and second bands.

12. Tuning apparatus for tuning channels in lower and upper frequency bands comprising:
    a RF signal input;
    a RF amplifier having an input;
    a tunable filter coupled between said RF signal input and said input of said RF amplifier including first and second inductance elements connected in series, in the order named, between a point of reference and said RF signal input; third and fourth inductance elements and a varactor diode responsive to a tuning voltage connected in series, in the order named, between said RF signal input and said input of said RF amplifier;

a bandswitching diode responsive to a bandswitching signal connected between a point intermediate said first and second inductance elements and a point intermediate said third and fourth inductance elements; said bandswitching diode being rendered non-conductive when a channel in said lower frequency band is selected for tuning and being rendered conductive when a channel in said upper frequency band is selected for tuning; and a capacitance element connected in parallel with said bandswitching diode.

13. The tuning apparatus recited in claim 12 wherein:
said RF amplifier includes a field effect transistor (FET) having a gate electrode serving as the input of said amplifier.

14. The tuning apparatus recited in claim 12 wherein:
said first frequency band includes broadcast channels 2 through 6 and said second frequency band includes broadcast channels 7 through 13; and
said capacitance element and said first inductance element form a trap for inhibiting an RF signal corresponding to channel 7 from passing from said RF input to said input of said RF amplifier when said bandswitching diode is rendered conductive to tune channels in said first band.

15. The tuning apparatus recited in claim 12 wherein:
said FET has a drain electrode serving as the output of said amplifier;
second tunable filter means responsive to said tuning control signal is connected to said drain electrode of said FET; and
said capacitance element is selected to enhance tracking between said first and second tunable filter in said first frequency band as said tuning control signal is varied.

16. The tuning apparatus recited in claim 12 wherein:
said capacitance element and said first inductance element form a trap for inhibiting an unwanted signal from passing between said RF input and said input of said amplifier.

17. Tuning apparatus for tuning channels in first and second frequency bands comprising:

a tunable circuit including first and second inductance elements connected in series and a varactor diode responsive to a tuning control voltage;

bandswitching means having a high impedance state and a low impedance state selectable in response to a bandswitching signal and connected to a point intermediate said first and second inductance elements for configuring said tunable circuit for tuning channels in said first band when in said high impedance state and for configuring said tunable circuit for tuning channels in said second band when in said low impedance state; and an additional reactance element connected in parallel with said bandswitching means.

18. The tuning apparatus recited in claim 17 wherein:
said reactance element is capacitive.

19. The tuning apparatus recited in claim 18 wherein:
said capacitive reactance element with said first inductance element forms a series trap for an unwanted signal when said bandswitching diode is in said high impedance state.

20. The tuning apparatus recited in claim 18 wherein:
said capacitance reactance element is a tracking adjustment element.

21. Tuning apparatus, comprising:
a tuned circuit including a variable capacitance element controllable in response to a tuning control signal, and at least first and second inductance elements;

bandswitching means having a high impedance state and a low impedance selectable in response to a bandswitching signal and connected to at least one of said first and second inductance elements for selectively changing the inductance of said tuned circuit in response to said bandswitching signal: and an additional capacitance element connected in parallel with said bandswitching means to be functionally connected to said tuned circuit when said bandswitching means is in said high impedance state and functionally disconnected from said tuned circuit when said bandswitching means is in said low impedance state.

* * * * *

UNITED STATES PATENT AND TRADEMARK OFFICE
CERTIFICATE OF CORRECTION

PATENT NO. : 4,905,306

DATED : February 27, 1990

INVENTOR(S) : William D. Anderson

It is certified that error appears in the above-identified patent and that said Letters Patent is hereby corrected as shown below:

Column 9, line 44 (Claim 1): after "said" and before "band" insert -- first --.

Signed and Sealed this

Twenty-second Day of January, 1991

Attest:

HARRY F. MANBECK, JR.

*Attesting Officer*  *Commissioner of Patents and Trademarks*